US012588539B2

(12) United States Patent (10) Patent No.: US 12,588,539 B2
Sato (45) Date of Patent: Mar. 24, 2026

(54) SEMICONDUCTOR DEVICE, METHOD FOR MANUFACTURING SAME, AND ELECTRIC POWER CONVERTER

(71) Applicant: Mitsubishi Electric Corporation, Tokyo (JP)

(72) Inventor: Yuji Sato, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 485 days.

(21) Appl. No.: 17/913,442

(22) PCT Filed: May 28, 2020

(86) PCT No.: PCT/JP2020/021175
§ 371 (c)(1),
(2) Date: Sep. 22, 2022

(87) PCT Pub. No.: WO2021/240748
PCT Pub. Date: Dec. 2, 2021

(65) Prior Publication Data
US 2023/0197649 A1 Jun. 22, 2023

(51) Int. Cl.
H01L 23/00 (2006.01)
H02M 7/5387 (2007.01)
(52) U.S. Cl.
CPC .............. H01L 24/05 (2013.01); H01L 24/03 (2013.01); H01L 24/06 (2013.01); H01L 24/45 (2013.01); H01L 24/85 (2013.01); *H01L 2224/03614* (2013.01); *H01L 2224/04042* (2013.01); *H01L 2224/05012* (2013.01);
(Continued)
(58) Field of Classification Search
CPC . H01L 2224/04042; H01L 2224/05557; H01L 2224/05018; H01L 24/05; H01L 2224/0603
See application file for complete search history.

(56) References Cited

U.S. PATENT DOCUMENTS

2006/0097407 A1* 5/2006 Ito ........................... H01L 24/03
257/784
2013/0277833 A1* 10/2013 Baek ..................... H01L 21/563
257/737
2014/0042633 A1* 2/2014 Hong .................... H01L 23/481
257/773

FOREIGN PATENT DOCUMENTS

JP 63-10551 U 1/1988
JP 63-64035 U 4/1988
(Continued)

OTHER PUBLICATIONS

International Search Report and Written Opinion mailed on Aug. 11, 2020, received for PCT Application PCT/JP2020/021175, filed on May 28, 2020, 12 pages including English Translation.
(Continued)

*Primary Examiner* — Jessica S Manno
*Assistant Examiner* — Ricky Verdes
(74) *Attorney, Agent, or Firm* — XSENSUS LLP

(57) ABSTRACT

In a semiconductor device, a first structure including a first uneven unit and a second structure covering the first structure and including a second uneven unit are formed in a bonding region defined in a semiconductor substrate. Metal wiring is joined to the second uneven unit in the second structure. A depth of a recess in the second uneven unit is shallower than a depth of a recess in the first uneven unit. An insulating member defining the bonding region is formed so as to reach the semiconductor substrate.

16 Claims, 20 Drawing Sheets

(52) U.S. Cl.
CPC ............... *H01L 2224/05186* (2013.01); *H01L
2224/05557* (2013.01); *H01L 2224/05655*
(2013.01); *H01L 2224/05657* (2013.01); *H01L
2224/05671* (2013.01); *H01L 2224/0603*
(2013.01); *H01L 2224/45147* (2013.01); *H01L
2224/85* (2013.01); *H02M 7/53871* (2013.01)

(56)                    References Cited

FOREIGN PATENT DOCUMENTS

| | | | |
|---|---|---|---|
| JP | 2-25045 | A | 1/1990 |
| JP | 2013-80809 | A | 5/2013 |
| JP | 2014-27048 | A | 2/2014 |
| JP | 2016-115700 | A | 6/2016 |
| JP | 2020-43154 | A | 3/2020 |

OTHER PUBLICATIONS

Office Action issued Mar. 28, 2025 in counterpart German Patent
Application No. 11 2020 007 244.4.

* cited by examiner

SEMICONDUCTOR DEVICE, METHOD FOR MANUFACTURING SAME, AND ELECTRIC POWER CONVERTER

CROSS-REFERENCE TO RELATED APPLICATION

The present application is based on PCT filing PCT/JP2020/021175, filed May 28, 2020, the entire contents of which are incorporated herein by reference.

TECHNICAL FIELD

The present disclosure relates to a semiconductor device, a method for manufacturing the same, and an electric power converter.

BACKGROUND ART

In recent years, an electric power semiconductor device is required to have high current density. In order to increase the current density, a semiconductor device that can withstand driving under a high-temperature condition is required. In such the semiconductor device, it has been proposed that copper wiring (wire) is used as a metal wiring connecting the semiconductor device and an external terminal.

In general, in order to bond a metal wire having a diameter of about 100 μm to the semiconductor device, there is a technique of bonding the metal wire by applying vibration energy by an ultrasonic wave to the metal wire. In this technique, energy of the ultrasonic wave during the bonding of a copper wire as the metal wire is required to be larger than the energy of the ultrasonic wave during the bonding of an aluminum wire.

For this reason, when the copper wire is bonded, because a large load (energy load) acts on a semiconductor substrate itself on Which a semiconductor element and the like are formed, various measures reducing the load have been conventionally taken in the semiconductor device (PTL 1, PTL 2).

CITATION LIST

Patent Literature

PTL 1: Japanese Patent Laying-Open No. 2016-115700
PTL 2: Japanese Patent Laying-Open No. 02-025045

SUMMARY OF INVENTION

Technical Problem

In the semiconductor device, when the metal wiring including the copper wire is bonded, good bonding is required to be achieved while the load acting on the semiconductor substrate or the like is reduced.

The present disclosure has been made under such development, and an object of the present disclosure is to provide a semiconductor device in which the load on a base including the semiconductor substrate is reduced during bonding of the metal wiring, another object thereof is to provide a method for manufacturing such the semiconductor device, and still another object thereof is to provide an electric power converter to which such the semiconductor device is applied.

Solution to Problem

A semiconductor device according to the present disclosure includes a semiconductor substrate, a bonding region, a first structure, a second structure, and a metal wiring. A semiconductor element is formed on the semiconductor substrate. The bonding region is defined in the semiconductor substrate. The first structure includes a first uneven unit and is formed in the bonding region. The second structure includes a second uneven unit and is formed so as to cover the first structure. The metal wiring is joined to the second uneven unit in the second structure. A depth of a recess in the second uneven unit is shallower than a depth of a recess in the first uneven unit.

A method for manufacturing a semiconductor device according to the present disclosure includes the following processes. A semiconductor element is thrilled on a main surface of a semiconductor substrate. A first structure including a first uneven unit is formed on the main surface of the semiconductor substrate. A second structure including a second uneven unit is formed so as to cover the first structure. A bonding region is defined by forming an insulating member so as to surround at least the first structure and the second structure. The metal wiring is joined to the second structure in the bonding region. In the forming the first structure and the forming the second structure, the first structure and the second structure are formed such that a depth of a recess in the second uneven unit is shallower than a depth of a recess in the first uneven unit.

An electric power converter of the present disclosure includes a main conversion circuit including the semiconductor device, the main conversion circuit to convert and outputs input power, and a control circuit to output a control signal controlling the main conversion circuit to the main conversion circuit.

Advantageous Effects of Invention

According to the semiconductor device of the present disclosure, the second structure including the second uneven unit is formed in the bonding region so as to cover the first structure including the first uneven unit. The depth of the recess in the second uneven unit is shallower than the depth of the recess in the first uneven unit, and the metal wiring is joined to the second uneven unit of the second structure. Thus, the load on the base during the joining of the metal wiring to the bonding region is reduced, and good bonding between the metal wiring and the bonding region can be obtained.

According to the method for manufacturing a semiconductor device of the present disclosure, the first structure including the first uneven unit and the second structure including, the second uneven unit are sequentially formed such that the depth of the recess in the second uneven unit is shallower than the depth of the recess in the first uneven unit, and the bonding region is defined by the insulating member. The metal wiring is joined to the second structure in the bonding region. Thus, the load on the base during the joining of the metal wiring to the bonding region is reduced, and the metal wiring can be favorably joined to the bonding region.

The electric power converter of the present disclosure includes the main conversion circuit that includes the semiconductor device to convert and output input power. Thus, the reliability of the electric power converter can be improved.

DESCRIPTION OF EMBODIMENTS

First Embodiment

Figure 1:
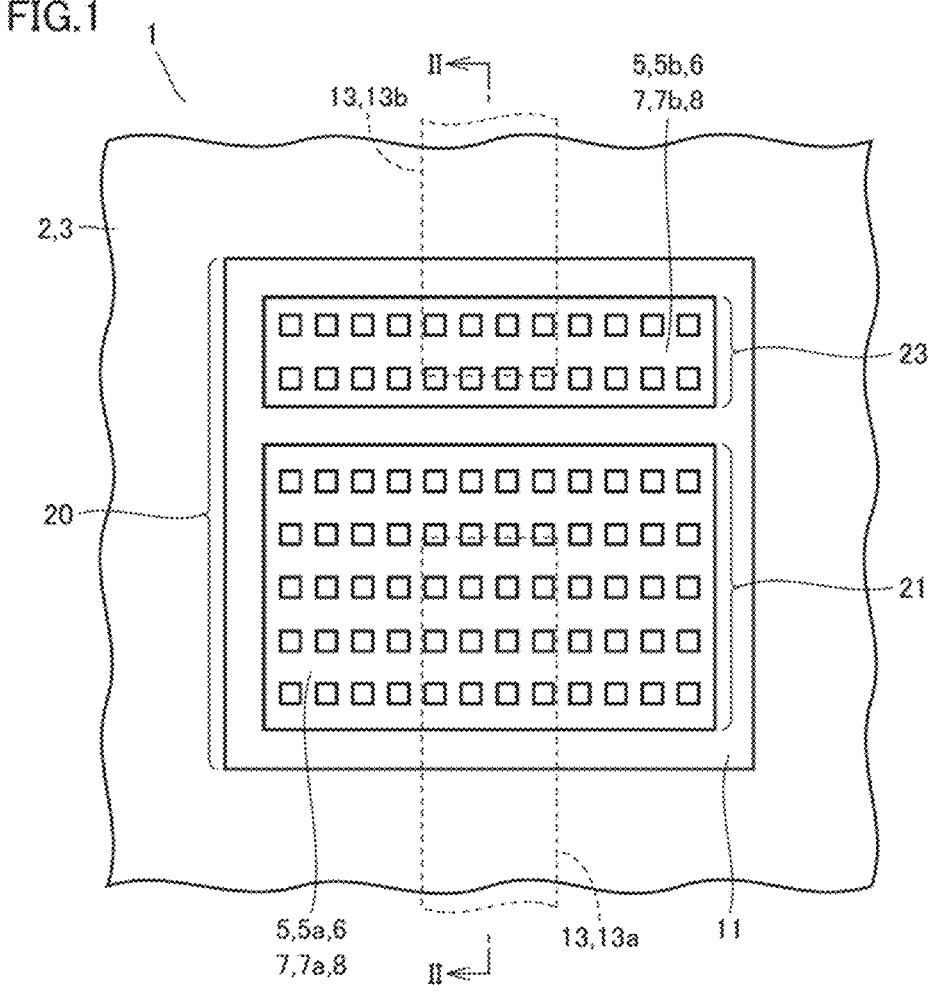
FIG. 1 is a plan view illustrating a bonding region in a semiconductor device according to a first embodiment.
Figure 2:
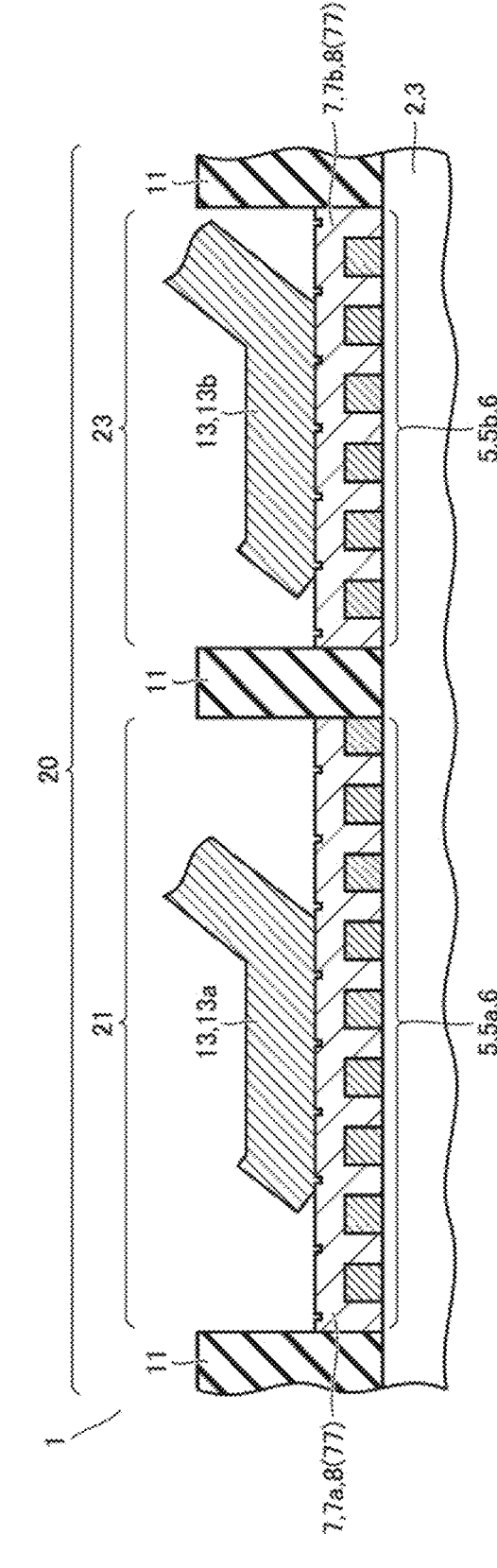
FIG. 2 is a sectional view illustrating the semiconductor device of the first embodiment taken along a line II-II in FIG. 1.

A semiconductor device according to a first embodiment will be described. As illustrated in FIGS. 1 and 2, in a semiconductor device 1, a bonding region 20 to which a metal wiring 13 is bonded is defined on one main surface of a semiconductor substrate 3 (semiconductor device) on which a semiconductor element 2 is formed. For example, a copper wiring (wire) is connected as metal wiring 13.

For example, an insulated gate bipolar transistor (IGBT) or a metal oxide semiconductor field effect transistor (MOS-FET) is formed as semiconductor element 2. For example, a Si substrate or a SiC substrate is applied as semiconductor substrate 3. A semiconductor element other than the ma and the MOSFET may be formed as semiconductor element 2. A GaN substrate may be applied as semiconductor substrate 3. For example, a thickness of a chip as semiconductor device 1 ranges from about 50 μm to about 500 μm.

An electrode may be formed on the other main surface (not illustrated) of semiconductor substrate 3. For example, gold (Au), copper (Cu), or nickel (Ni) is applied as a material of the electrode. An adhesion layer, a barrier layer, or an antioxidant layer may be formed between the other main surface of semiconductor substrate 3 and the electrode. For example, gold (Au), titanium (Ti), titanium nitride (TiN), or tungsten (W) is applied as the material of the adhesion layer or the like. The electrode may have a laminated structure of at least two layers. For example, the thickness of the electrode ranges from about 5 nm to about 50 μm. For example, the electrode is formed by plating or sputtering.

Bonding region 20 is defined by an insulating member 11. A first region 21 and a second region 23 are defined in bonding region 20. First region 21 and second region 23 are partitioned by insulating member 11. An area of first region 21 is set to be larger than an area of second region 23. There are no particular restrictions on a disposition structure, the material, and a shape of insulating member 11 as long as a function as the semiconductor device is not impaired.

A first structure 5a (5) including a first uneven unit 6 and a second structure 7a (7) including a second uneven unit 8 are formed in first region 21. Second structure 7a (7) is formed so as to cover first structure 5a (5). A first structure 5b (5) including first uneven unit 6 and a second structure 7b (7) including second uneven unit 8 are formed in second region 23. Second structure 7b (7) is formed so as to cover first structure 5b (5).

First structure 5 including first uneven unit 6 is disposed on one main surface of semiconductor substrate 3 while a plurality of protrusions are separated from each other, for example, in an island shape. First structure 5 may be directly formed on the main surface of semiconductor substrate 3. A layer achieving adhesion or a layer achieving electric connection may be interposed between first structure 5 and the main surface of semiconductor substrate 3. For example, titanium (Ti), tungsten (W), nickel (Ni), or an alloy mainly containing these metals is applied as a material of such the layer. The material is not limited to these materials as long as the material can achieve the adhesion or the electric connectivity.

For example, a metal such as aluminum (Al), copper (Cu), nickel (Ni), or tungsten (W), silicon (Si), an oxide film, or the like is applied as a material of first structure 5. The material is not limited to these materials as long as the function as semiconductor device 1 is not inhibited.

As an example, first uneven unit 6 of first structure 5 is formed as a dot-shaped protrusion. For example, a length (width) of one side of the protrusion of first uneven unit 6 ranges from about 1 μm to about 10 μm. For example, a height of the protrusion ranges from about 0.5 μm to about 5 μm. For example, a distance between the adjacent protrusions ranges from about 0.5 μm to about 5 μm.

Second structure 7 including second uneven unit 8 is formed of a metal layer 77. When metal layer 77 is formed so as to cover first uneven unit 6 of first structure 5, for example, second uneven unit 8 is formed by reflecting underlying first uneven unit 6 on metal layer 77. For this reason, second uneven unit 8 is also formed in the dot shape.

For example, aluminum (Al), copper (Cu), nickel (Ni), cobalt (Co), or chromium (Cr) is applied as the material of second structure 7 (metal layer 77). As the hardness of second structure 7 (metal layer 77), the Vickers hardness measured with a Vickers hardness meter is preferably greater than or equal to 300. When the Vickers hardness is greater than or equal to 300, favorable joining can be achieved while reducing the load acting during wire bonding. The material of metal layer 77 is not limited to the above-described material as long as the function as semiconductor device 1 is impaired.

An oxidation prevention layer (not illustrated) may be formed on the surface of second structure 7 in order to prevent oxidation of metal layer 77. Gold (Au), silver (Ag), palladium (Pg), or an alloy layer of these metals can be applied as the antioxidant layer. In addition, an organic protective film or the like can also be applied as the antioxidant layer.

For example, the thickness of second structure 7 ranges from about 1 μm to about 50 μm. The thickness of second structure 7 corresponds to the distance between the upper end and the lower end of second structure 7. A depth D2 of a recess of second uneven unit 8 in second structure 7 is shallower than a depth D1 of a recess of first uneven unit 6 in first structure 5 (see FIG. 7). For example, the depth of the recess of second uneven unit 8 is preferably less than or equal to 5 μm.

The shape of second uneven unit 8 of second structure 7 is different from roughness of the surface of metal layer 77. The depth of the recess of first uneven unit 6 and the depth of the recess of second uneven unit 8 are larger than surface roughness (Ra) of metal layer 77 with respect to an average film thickness of metal layer 77.

For example, a copper wiring is preferable as metal wiring 13 joined to bonding region 20. The copper wiring includes pure copper or a copper alloy. Metal wiring 13 may be the copper wiring in which an outermost surface of the copper wiring is coated with palladium (Pd), aluminum (Al), gold (Au), silver (Ag), or the like. Metal wiring 13 is not limited to the copper wiring, but for example, an aluminum wiring or the like can also be applied. As the metal wiring 13, for example, a nickel wiring can also be applied.

The wire is preferably as the shape of metal wiring 13. For example, the thickness (ϕ) of the wire ranges from about 100 μm to about 500 μm. For example, the shape of metal wiring 13 may be plate-shaped metal wiring 13 or foil-shaped metal wiring 13 in addition to the wire.

For example, a copper wire is joined to bonding region 20 by ultrasonic wave as metal wiring 13. In second structure 7, the portion of metal wiring 13 enters the recess region of second uneven unit 8 in the portion to which metal wiring 13 is joined such that the recess is embedded. As long as the contact area between the copper wire and bonding region 20 can be secured while the load acting during the wire bonding is reduced, metal wiring 13 may be, joined such that a cavity is left in the recess region of second uneven unit 8.

Insulating member 11 is formed so as to cover semiconductor substrate 3 on which semiconductor element 2 is formed. Insulating member 11 is formed so as to reach semiconductor substrate 3. Insulating member 11 defines bonding region 20. Insulating member 11 defines first region 21 and the second region 23. The area of second region 23 is set to be smaller than the area of first region 21.

The shape, the material, and the shape of insulating member 11 are not particularly limited as long as the function as the semiconductor device is not impaired. For example, insulating member 11 may be formed so as to reach second structure 7 in addition to the structure in which insulating member 11 is formed so as to reach semiconductor substrate 3. Insulating member 11 may be formed so as to reach first structure 5.

First uneven unit 6 of first structure 5a and second uneven unit 8 of second structure 7 are located in first region 21 surrounded by insulating, member 11. First uneven unit 6 of first structure 5b and second uneven unit 8 of second structure 7 are located in second region 23 surrounded by insulating member 11. First uneven unit 6 and second uneven unit 8 may be formed in at least second region 23 having the smaller area out of first region 21 and second region 23.

When first uneven unit 6 and second uneven unit 8 are formed in both first region 21 and second region 23, first uneven unit 6 and second uneven unit 8 may have the same shape or different shapes in first region 21 and second region 23.

For example the protrusion of first uneven unit 6 of first structure 5 is periodically formed. Second structure 7 including second uneven unit 8 is formed so as to cover first structure 5. Second structure 7 may be formed so as to be embedded between the protrusions of first uneven unit 6, or formed such that the cavity is partially left between the protrusions.

Second uneven unit 8 of second structure 7 may have an uneven shape reflecting the uneven shape of first uneven unit 6 of first structure 5, or have an uneven shape independent of uneven shape of first uneven unit 6 of first structure 5. The depth of the recess of second uneven unit 8 in second structure 7 is shallower than the depth of the recess of first uneven unit 6 in first structure 5. The depth of the recess of second uneven unit 8 is desirably less than or equal to 80% of the depth of the recess in first uneven unit 6. Semiconductor device 1 of the first embodiment is configured as described above.

An example of a method for manufacturing semiconductor device 1 will be described below. The manufacturing process roughly includes three of a first manufacturing process, a second manufacturing process, and a third manufacturing process. First structure 5 including first uneven unit 6 is formed in the first manufacturing process. Second structure 7 including second uneven unit 8 is formed in the second manufacturing process. The metal wiring is joined in the third manufacturing process.

Figure 3:
FIG. 3 is a sectional view illustrating one process of a method for manufacturing the semiconductor device of the first embodiment.

First, the first manufacturing process will be described. Semiconductor element 2 and the like are formed on semiconductor substrate 3 (see FIG. 3). Subsequently, as illustrated in FIG. 3, a photoresist 51 is applied so as to cover the main surface of semiconductor substrate 3 on which the semiconductor element 2 and the like are formed. Examples of photoresist 51 include a positive resist and a negative resist. Any one of the positive resist and the negative resist may be used as long as the first uneven unit can be patterned as designed.

Figure 4:
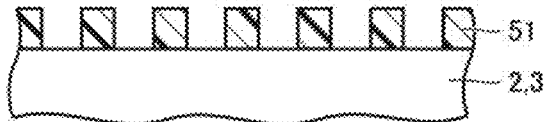
FIG. 4 is a sectional view illustrating a process performed after the process in FIG. 3 of the first embodiment.

Subsequently, photoengraving processing is performed on photoresist 51. A photomask corresponding to the pattern of the first structure is set in an exposure device (not illustrated), and the pattern of the photomask is transferred to photoresist 51 by irradiation with an ultraviolet ray. By immersing photoresist 51 irradiated with the ultraviolet ray in a developer, a portion of the uncured photoresist is removed. Thus, as illustrated in FIG. 4, the pattern of photoresist 51 is formed in order to form the first structure.

Figure 5:
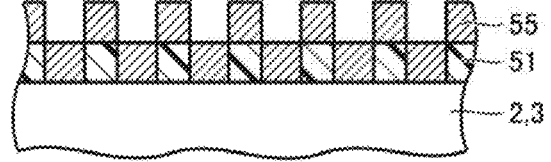
FIG. 5 is a sectional view illustrating a process performed after the process in FIG. 4 of the first embodiment.

Subsequently, as illustrated in FIG. 5, a metal layer 55 that becomes the first structure is formed so as to cover the pattern of photoresist 51. As a method for forming metal layer 55, for example, there is a sputtering method as one of physical vapor deposition (PVD). Examples of the sputtering method include a magnetron sputtering method, a vapor deposition method, and an ion beam sputtering method. Any sputtering method may be applied as long as first uneven unit 6 can be formed. Any condition (type of power source (DC type, AC type), power, heating, flow rate, assisted film formation, and the like) may be set as long as first uneven unit 6 can be formed as the condition during the formation of metal layer 55 by the sputtering method.

For example, there is a plating method in addition to the sputtering method. The plating method includes electroless plating and electrolytic plating. Any plating method and condition may be set as long as first uneven unit 6 can be formed as the type of plating method and the condition in which metal layer 55 is formed by the plating method.

When the electrolytic plating is applied, a seed layer is required to be formed. An adhesive film is required to be formed as needed. Examples of a method for forming the seed layer and the adhesion layer include a physical vapor deposition method and a chemical vapor deposition (CVD) method. Any method may be applied as long as first structure 5 can be formed. From the viewpoint of the configuration of semiconductor device 1 and the like, the sputtering method is desirable as the method for forming the seed layer and the adhesion layer.

Furthermore, when first structure 5 is formed of an oxide film, there is the chemical vapor deposition method as the method for forming the oxide, film. For example, a silicon oxide film can be formed using a monosilane gas and oxygen.

Figure 6:
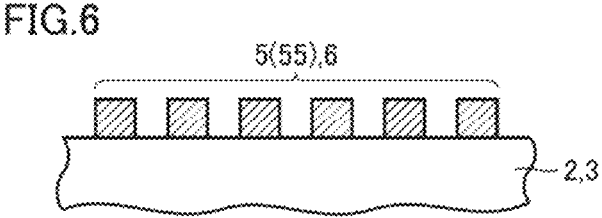
FIG. 6 is a sectional view illustrating a process performed after the process in FIG. 5 of the first embodiment.

Subsequently, as illustrated in FIG. 6, the pattern of photoresist 51 is removed. Examples of a method for removing photoresist 51 include wet etching processing and dry etching processing. In order to remove photoresist 51 while maintaining the shape of first uneven unit 6, desirably photoresist 51 is selectively removed by the wet etching processing. An etching solution is not particularly limited as long as photoresist 51 can be removed while the shape of first uneven unit 6 is maintained. Thus, the first manufacturing process is completed.

Figure 7:
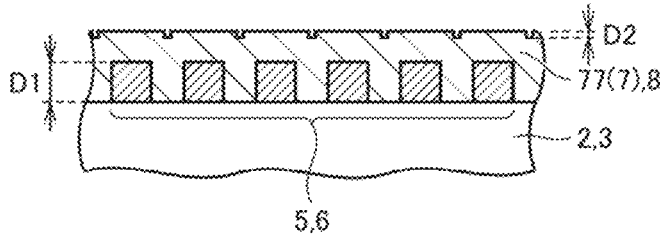
FIG. 7 is a sectional view illustrating, a process performed after the process in FIG. 6 of the first embodiment.

Subsequently, the second manufacturing process will be described. As illustrated in FIG. 7, metal layer 77 is formed so as to cover first structure 5. At this point, the thickness of metal layer 77 is set to the thickness that reflects the shape of the base. Because first structure 5 includes first uneven unit 6, second uneven unit 8 reflecting the shape of first uneven unit 6 is formed on metal layer 77 without additional processing. At this point, depth D2 of the recess of second uneven unit 8 in second structure 7 is formed to be shallower than depth D1 of the recess of first uneven unit 6 in first structure 5. For example, the case where the shape of the base is not reflected on metal layer 77 will be described later as a modification. Thus, the second manufacturing process is completed.

Figure 8:
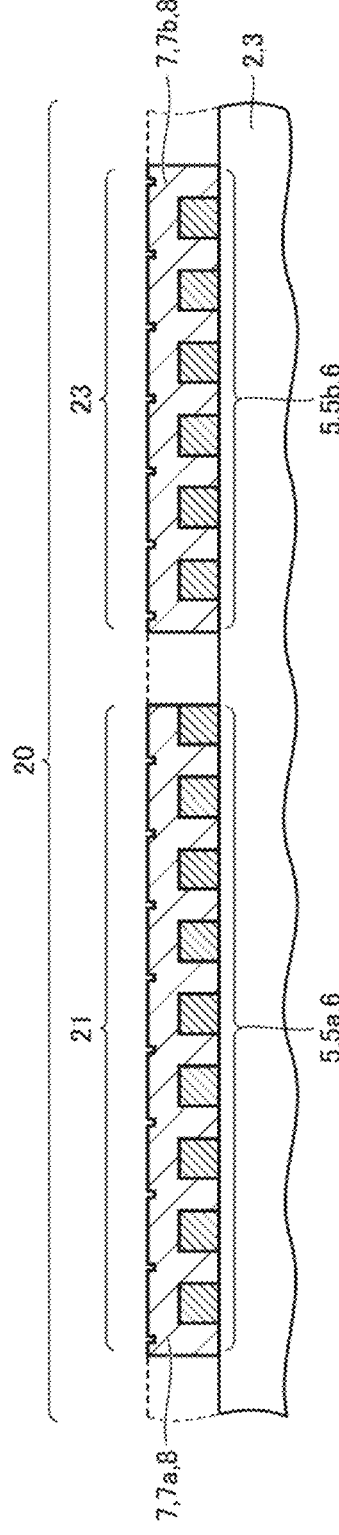
FIG. 8 is a sectional view illustrating a process performed after the process in FIG. 7 of the first embodiment.
Figure 9:
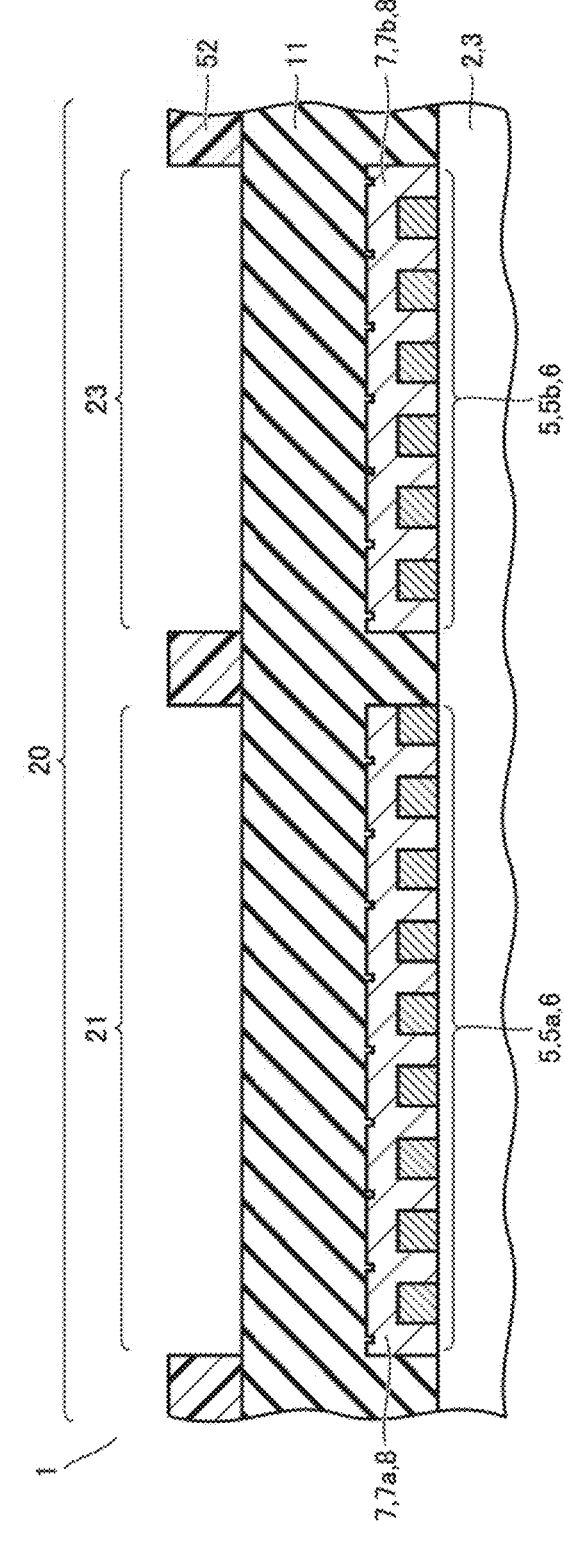
FIG. 9 is a sectional view illustrating a process performed after the process in FIG. 8 of the first embodiment.

Subsequently, the third manufacturing process will be described. Processing for forming insulating member 11 in bonding region 20 is performed. As illustrated in FIG. 8, the surface of semiconductor substrate 3 located in the region where the insulating member is to be disposed is exposed by performing the photolithography processing and the etching processing on metal layer 77 and the like. Subsequently, as illustrated in FIG. 9, insulating member 11 is formed by, for example, the chemical vapor deposition so as to cover semiconductor substrate 3. Subsequently, the photoengraving processing is performed to form the pattern of photoresist 52. Photoresist 52 is formed in a pattern that defines bonding region 20 and partitions first region 21 and second region 23.

Figure 10:
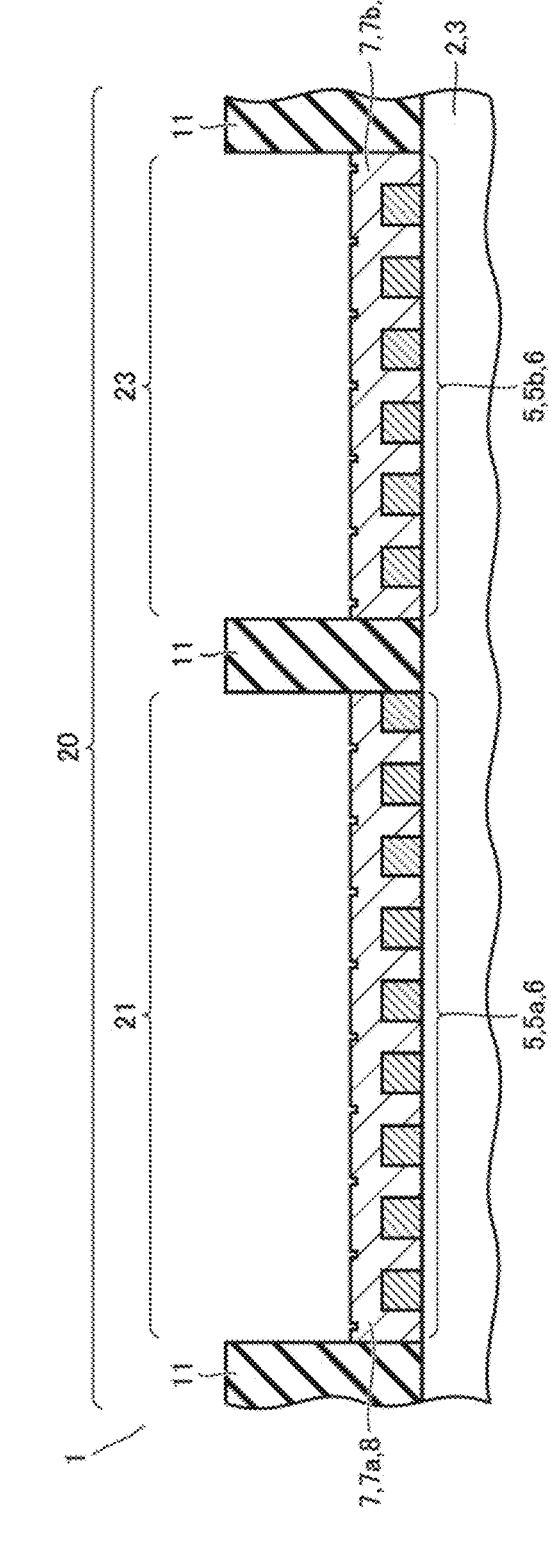
FIG. 10 is a sectional view illustrating a process performed after the process in FIG. 9 of the first embodiment.

Subsequently, as illustrated in FIG. 10, for example, the dry etching processing is performed on insulating member 11 using the pattern of photoresist 52 as the etching mask, thereby exposing second structure 7. Thereafter, photoresist 52 is removed. Thus, insulating member 11 defining first region 21 and second region 23 while defining banding region 20 is patterned.

Subsequently, metal wiring 13 (13a, 13b) is joined to bonding region 20. As metal wiring 13a, the copper wire is joined to second structure 7a (7) of first region 21 by the ultrasonic wave. As metal wiring 13b, the copper wire is joined to second structure 7b (7) of second region 23 by the ultrasonic wave. Thus, as illustrated in FIG. 2, metal wiring 13a of the copper wire is joined to second structure 7a of first region 21, and metal wiring 13b of the copper wire is joined to second structure 7b of second region 23. In this way, the third manufacturing process is completed, and the main part of semiconductor device 1 is completed.

In semiconductor device 1 described above, the copper wire as metal wiring 13 is joined to second structure 7 including second uneven unit 8 formed in bonding region 20. For this reason, when the copper wire is joined to second structure 7 by the ultrasonic wave, the energy of the ultrasonic wave is dispersed by second uneven unit 8. Furthermore, second structure 7 in which second uneven unit 8 is formed is laminated on first structure 5 in which first uneven unit 6 is formed. Thus, the energy of the ultrasonic wave is effectively dispersed. The contact area between the copper wire and second structure 7 (bonding region 20) increases, and frictional force required for joining the copper wire can be effectively obtained.

As a result, as compared with the case of joining the aluminum wire, the copper wire requiring the larger ultrasonic wave energy can be joined without applying the large load to bonding region 20 and the like.

In addition, because insulating member 11 that defines bonding region 20 is formed so as to reach semiconductor substrate 3, the influence of the ultrasonic wave can be also prevent from reaching the outside of bonding region 20.

Conventionally, there is a technique for previously forming the copper film having the thickness of about 30 μm in the bonding region in order to join the copper wire (PTL 1). As compared with the conventional technique, the process of forming the copper film while controlling the thickness of the copper film is unnecessary, and the time required for the manufacturing can be reduced. In addition, it is possible to contribute to the reduction in production cost.

In addition, conventionally, there is a technique in which the bonding region to which the metal wire is joined has an uneven shape (PTL 2). In the conventional method, when the depth of the recess is large, it is difficult to sufficiently secure the contact area between the metal wire and the bonding region. As compared with this technique, in semiconductor device 1 described above, the contact area between the copper wire as metal wiring 13 and second structure 7 (bonding region) is reliably secured, for example, by setting the depth of the recess of second uneven unit 8 to less than or equal to 80% of the depth of the recess of first uneven unit 6. As a result, the copper wire can be firmly joined to bonding region 20.

Furthermore, in a general power semiconductor device, an area of a gate pad electrically connected to a gate electrode such as the IGBT is relatively narrow, and a surface of the gate pad is flat. In semiconductor device 1 described above, among first region 21 and second region 23 in bonding region 20, second region 23 having the narrow area can be used as the gate pad, and the copper wire as metal wiring 13 can be joined to second structure 7 of second region 23. Thus, the copper wire is reliably joined to the gate pad, and the reliability as semiconductor device 1 can be improved.

First Modification

The case where second uneven unit 8 is intentionally formed in metal layer 77 (see FIG. 7) that becomes the second structure will be described. For example, when the shape of the base is not reflected on metal layer 77, second uneven unit 8 is required to be formed on metal layer 77. In addition, there is the case where second uneven unit 8 including a pattern different from that of first uneven unit 6 of first structure 5 is formed on metal layer 77.

Figure 11:
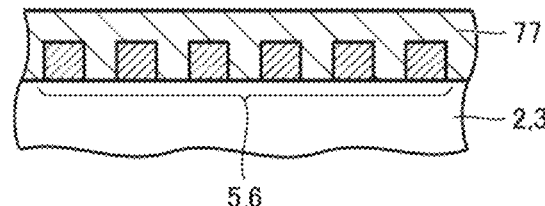
FIG. 11 is a sectional view illustrating one process of a method for manufacturing the semiconductor device according to a first modification of the first embodiment.
Figure 12:
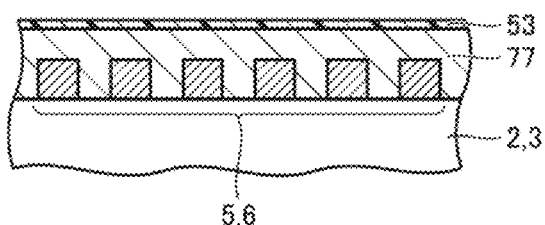
FIG. 12 is a sectional view illustrating a process performed after the process in FIG. 11 of the first embodiment.
Figure 13:
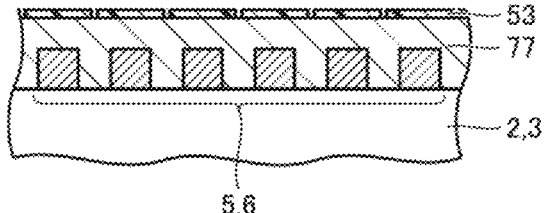
FIG. 13 is a sectional view illustrating a process performed after the process in FIG. 12 of the first embodiment.

As illustrated in FIG. 11, metal layer 77 that becomes the second structure is formed so as to cover first structure 5. At this point, for the sake of explanation, the surface of metal layer 77 is flat. Subsequently, as illustrated in FIG. 12, a photoresist 53 is applied so as to cover metal layer 77. Subsequently, as illustrated in FIG. 13, a pattern of photoresist 53 is formed by performing photoengraving processing in order to form second structure 7 including second uneven unit 8.

Figure 14:
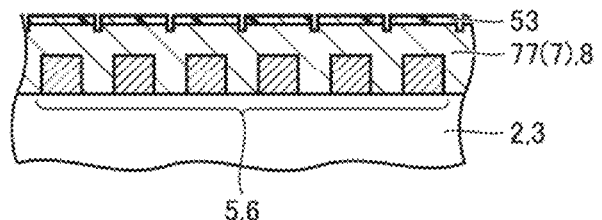
FIG. 14 is a sectional view illustrating a process performed after the process in FIG. 13 of the first embodiment.
Figure 15:
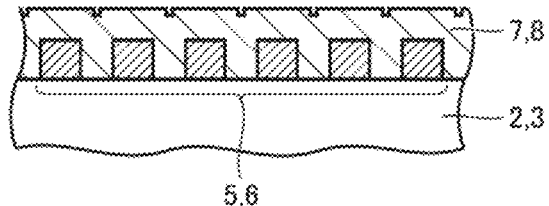
FIG. 15 is a sectional view illustrating a process performed after the process in FIG. 14 of the first embodiment.

Subsequently, as illustrated in FIG. 14, metal layer 77 is subjected to, for example, dry etching processing using the pattern of photoresist 53 as an etching mask, thereby forming second structure 7 including second uneven unit 8. Subsequently, as illustrated in FIG. 15, photoresist 53 is removed. Thereafter, semiconductor device 1 in which metal wiring 13 is joined to bonding region 20 is manufactured through processes similar to those in FIGS. 8 to 10 (see FIG. 2).

In semiconductor device 1 according to a first modification, when the shape of the base is not reflected on metal layer 77, second uneven unit 8 can be formed on metal layer 77, and metal wiring 13 can be firmly joined to bonding region 20. In addition, second uneven unit 8 (second structure 7) having an appropriate depth and pattern, corresponding to the joining condition of metal wiring 13 to bonding region 20 can be formed. Thus, metal wiring 13 can be joined to second structure 7 including second uneven unit 8 optimal for various joining conditions.

Second Modification

In semiconductor device 1 described above, the description has been given by exemplifying the case where first uneven unit 6 is formed as the dot-shaped protrusion and second uneven unit 8 is formed with the dot-shaped protrusion reflecting dot-shaped first uneven unit 6. Variations of patterns of the protrusion or the recess of first uneven unit 6 and second uneven unit 8 will be described below.

Figure 16:
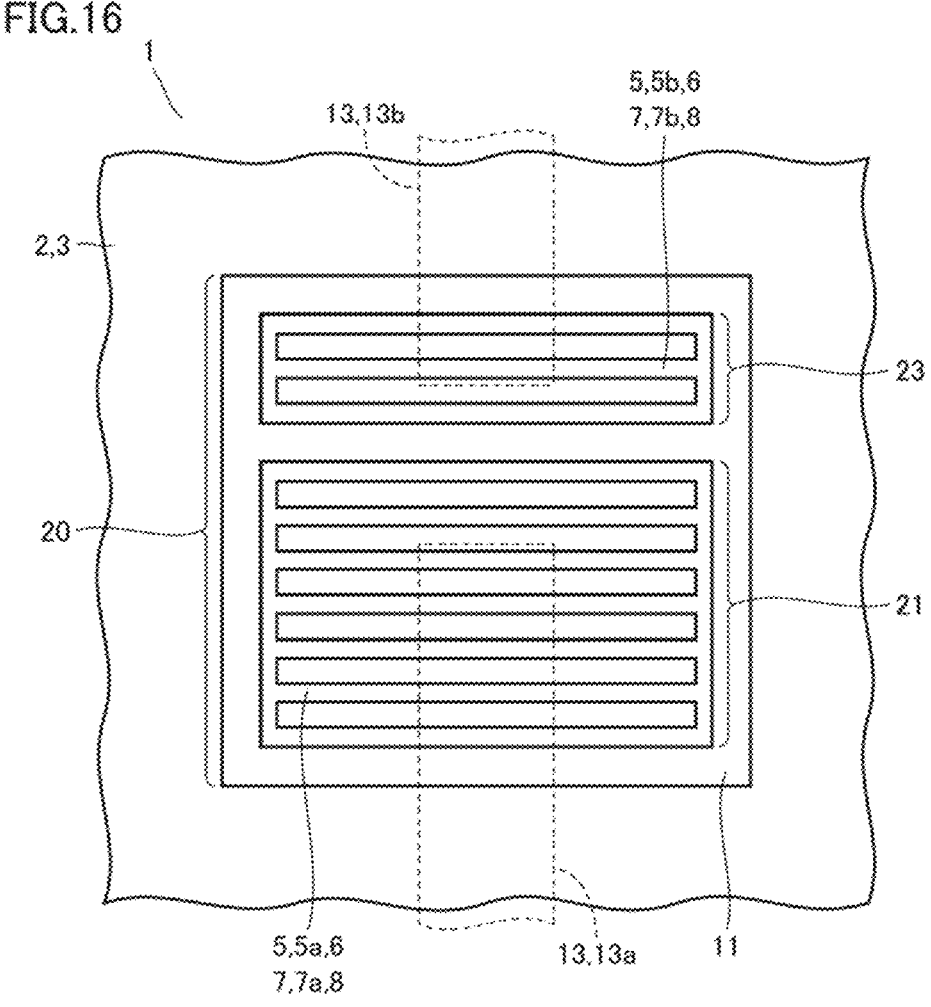
FIG. 16 is a first plan view illustrating a bonding region in a semiconductor device according to a second modification of the first embodiment.
Figure 17:
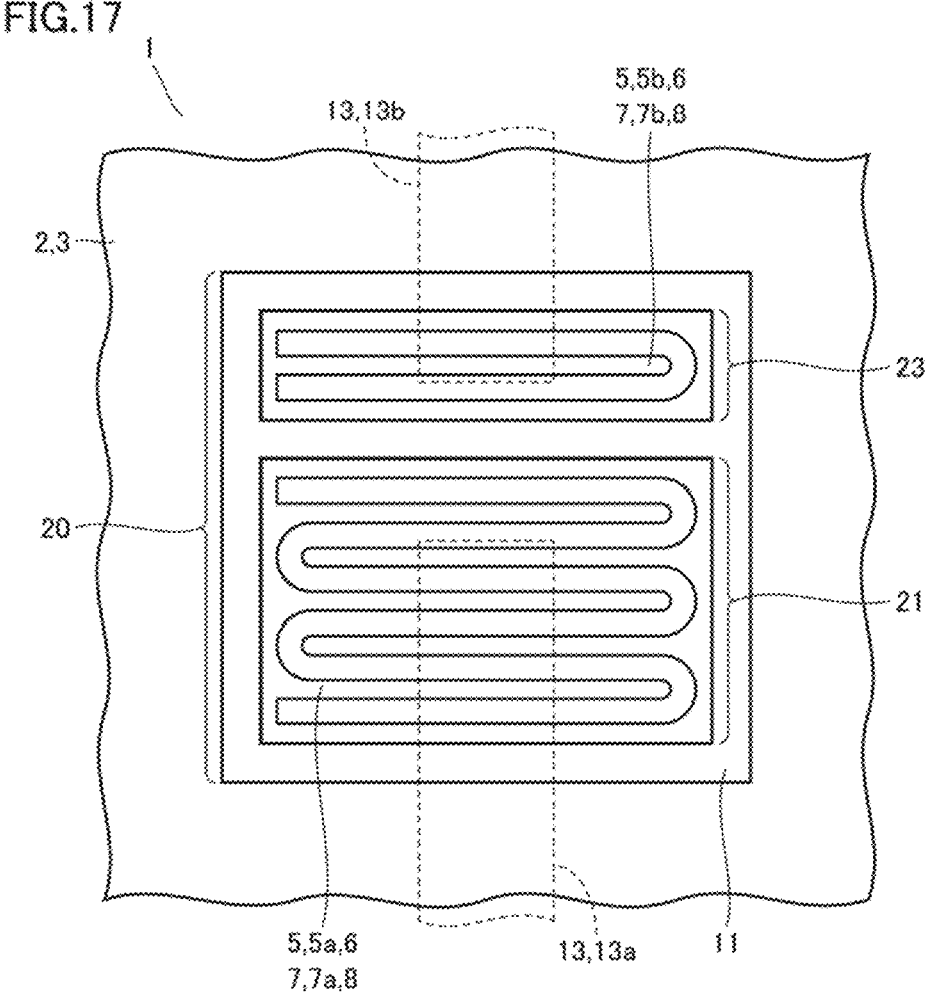
FIG. 17 is a second plan view illustrating the bonding region in the semiconductor device of the second modification of the first embodiment.
Figure 18:
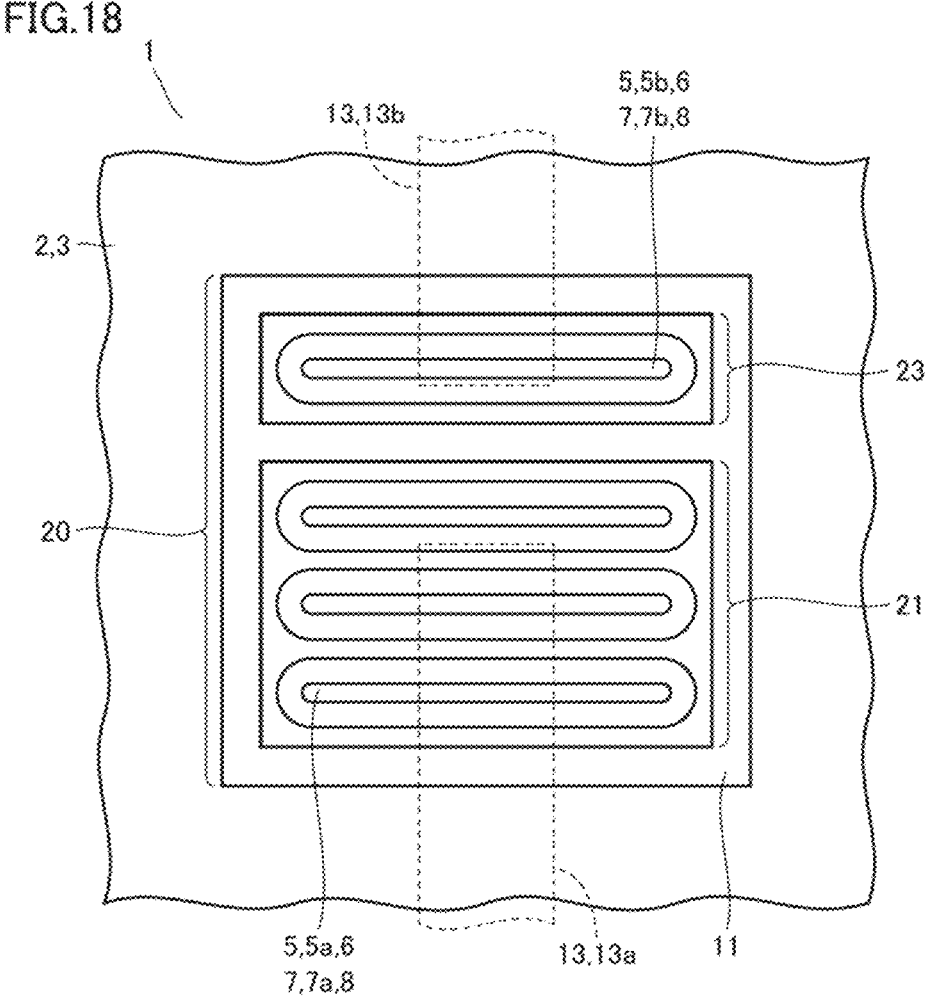
FIG. 18 is a third plan view illustrating a bonding region in a semiconductor device according to a second modification in the same embodiment.

As illustrated in FIG. 16, for example, first uneven unit 6 and second uneven unit 8 may be a stripe-shaped pattern. As illustrated in FIG. 17, for example, first uneven unit 6 and second uneven unit 8 may be a meandering pattern. Further, as illustrated in FIG. 18, for example, first uneven unit 6 and second uneven unit 8 may be a track-shaped (elliptical) pattern.

Third Modification

A semiconductor device in which an intermediate structure is interposed between first structure 5 and second structure 7 will be described below. The intermediate structure is formed in order to improve the adhesion between first structure 5 and second structure 7. The intermediate structure is formed in order to prevent diffusion of each material between first structure 5 and second structure 7.

Figure 19:
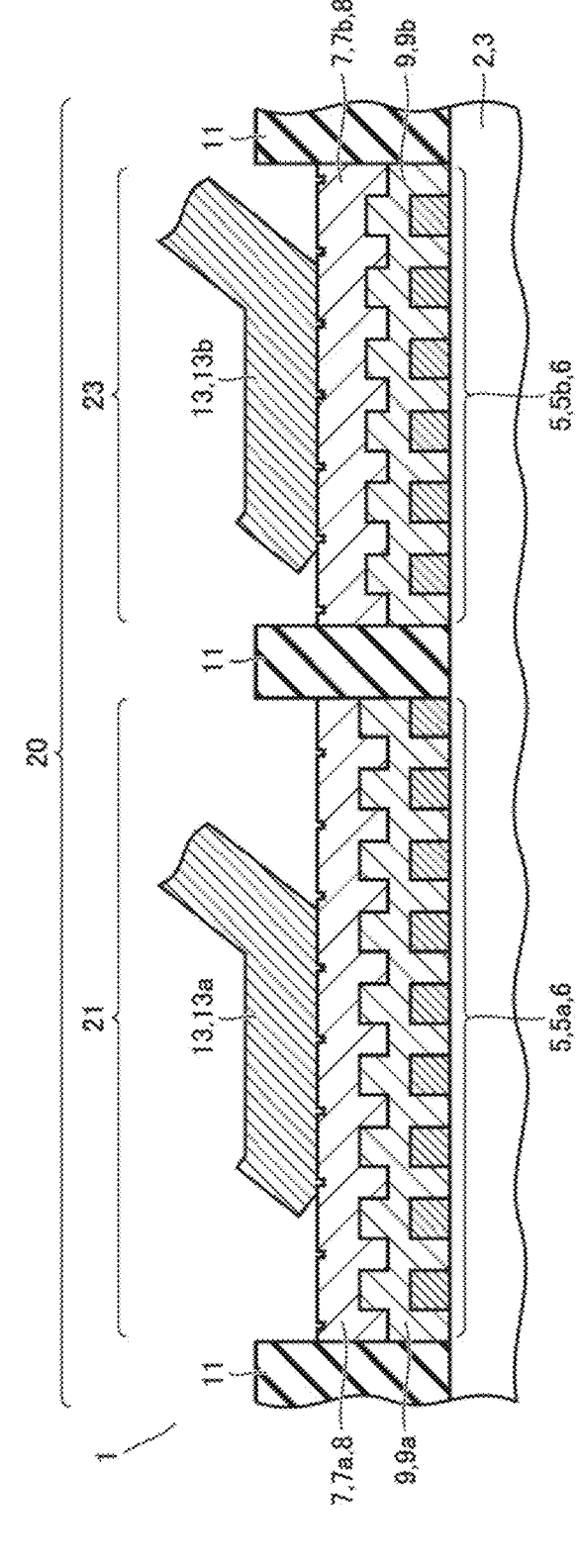
FIG. 19 is a sectional view illustrating a semiconductor device according to a third modification of the first embodiment.

As illustrated in FIG. 19, in bonding region 20, an intermediate structure 9 is interposed between first structure 5 and second structure 7. In first region 21, an intermediate structure 9a is interposed between first structure 5a and second structure 7a. In second region 23, an intermediate structure 9b is interposed between first structure 5b and second structure 7b.

Intermediate structure 9 may be a single layer or a plurality of layers. Examples of the material of intermediate structure 9 include aluminum (Al), copper (Cu), nickel (Ni), tungsten (W), cobalt (Co), chromium (Cr), or titanium (Ti). Examples of the material of intermediate structure 9 include alloys of these metals. The material is not limited to these materials as long as the function as semiconductor device 1 is not impaired but the electric connection, the adhesion, and the prevention of the diffusion can be improved. In addition, characteristics such as the density, the surface roughness, and the electric conductivity are not particularly limited as the material of intermediate structure 9.

Furthermore, the shape of intermediate structure 9 is not particularly limited as long as the energy of the ultrasonic wave is effectively dispersed and the frictional force required for joining the copper wire can be effectively obtained, but for example, the uneven shape may not be formed in intermediate structure 9. In addition, intermediate structure 9 may be formed so as to be embedded between the protrusions of first uneven unit 6, or formed such that the cavity is partially left between the protrusions.

When the uneven shape is not formed in intermediate structure 9, second structure 7 including second uneven unit 8 can be formed through processes similar to the processes in FIGS. 11 to 15 described above during the formation of second structure 7.

When the uneven shape is formed in intermediate structure 9, the uneven shape may be an uneven shape reflecting the shape of first uneven unit 6 or an uneven shape having a pattern different from that of first uneven unit 6. Furthermore, the depth of the recess of the uneven shape in intermediate structure 9 is also not particularly limited.

When the uneven shape is formed in intermediate structure 9, when metal layer 77 can reflect the shape of the base when forming second structure 7, an additional process of forming second uneven unit 8 in metal layer 77 becomes unnecessary.

In semiconductor device 1 of the third modification, intermediate structure 9 improving the adhesion and the like is formed, so that metal wiring 13 can be more firmly joined to bonding region 20.

In the case where second region 23 having the narrow area in first region 21 and second region 23 of bonding region 20 is applied as the gate pad, the gate pad and the gate electrode (for example, IGBT) are electrically connected by another wiring (not illustrated), so that the insulating film can be applied as intermediate structure 9.

Second Embodiment

In the first embodiment the case where the plurality of protrusions is disposed on the main surface of semiconductor substrate 3 while being separated from each other has been described as first structure 5. An example of a semiconductor device including continuous film-like first structure 5 will be described below.

Figure 20:
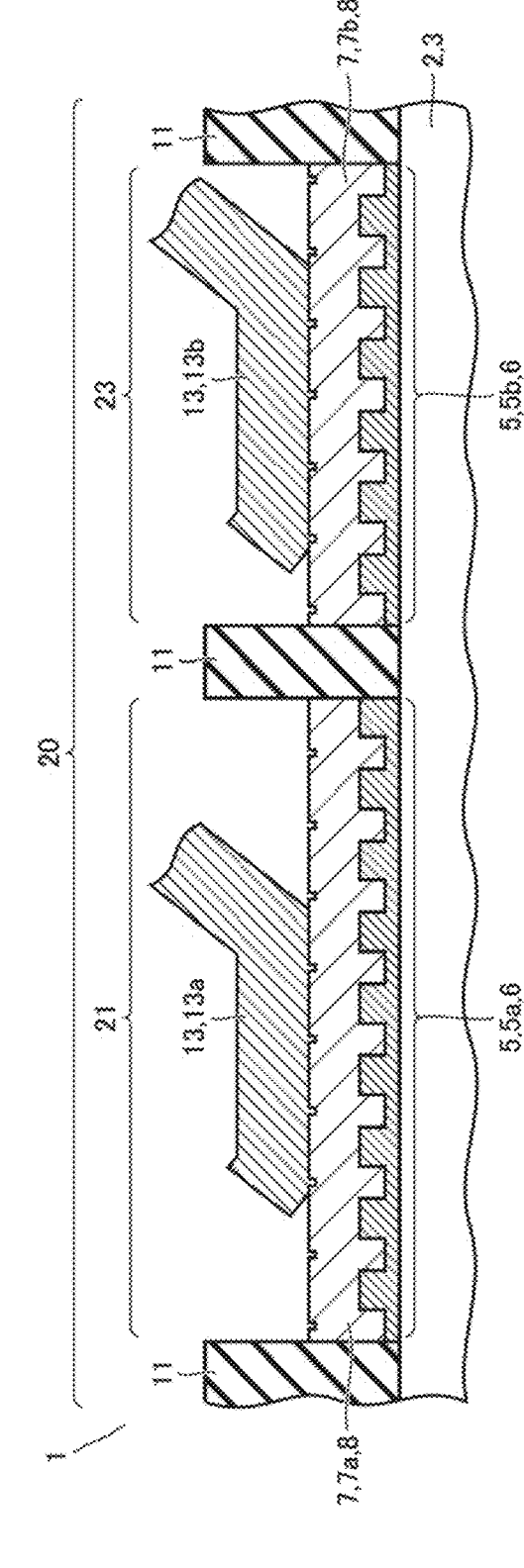
FIG. 20 is a sectional view illustrating a semiconductor device according to a second embodiment.

As illustrated in FIG. 20, continuous film-like first structure 5 having first uneven unit 6 is formed in bonding region 20 of semiconductor device 1. First structure 5 includes a portion extending in a film shape on the surface of semiconductor substrate 3 and a portion protruding from the film shape portion. For example, the height between the lower surface of the film-like portion and the upper surface of the protruding portion (the thickness of first structure 5) ranges about 1 μm to about 50 μm.

First structure 5a including first uneven unit 6 and second structure 7a including second uneven unit 8 are formed in first region 21. Second structure 7a is formed so as to cover film-like first structure 5a. First structure 5b including first uneven unit 6 and second structure 7b including second uneven unit 8 are formed in second region 23. Second structure 7b is formed so as to cover film-like first structure 5b.

Because other configurations are similar to those of semiconductor device 1 in FIG. 2 and the like, the same member is denoted by the same reference numeral, and the description will be omitted unless necessary.

Figure 21:
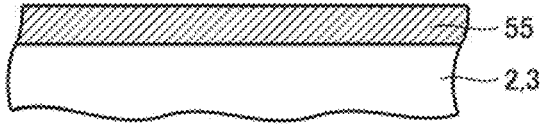
FIG. 21 is a sectional view illustrating one process of a method for manufacturing the semiconductor device of the second embodiment.
Figure 22:
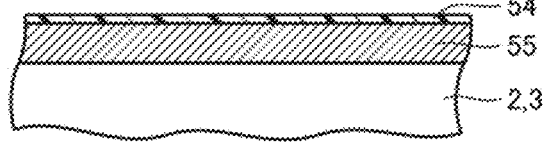
FIG. 22 is a sectional view illustrating a process performed after the process in FIG. 21 of the second embodiment.
Figure 23:
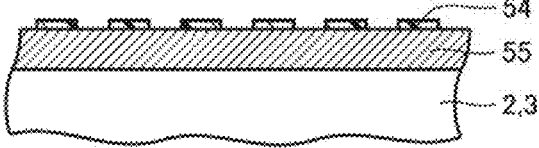
FIG. 23 is a sectional view illustrating a process performed after the process in FIG. 22 of the second embodiment.

An example of a method for manufacturing semiconductor device 1 will be described below. In particular, first structure 5 can be formed through processes similar to the processes in FIGS. 11 to 15. First, as illustrated in FIG. 21, metal layer 55 that becomes the first structure is formed on one main surface of semiconductor substrate 3. Subsequently, as illustrated in FIG. 22, photoresist 54 is applied so as to cover metal layer 55. Subsequently, as illustrated in FIG. 23, the pattern of photoresist 54 is formed by performing the photoengraving processing in order to form first structure 5 including first uneven unit 6.

Figure 24:
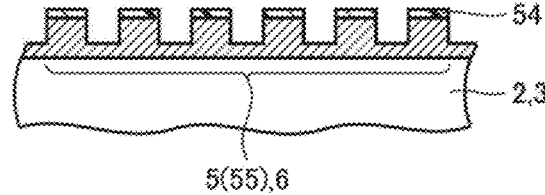
FIG. 24 is a sectional view illustrating a process performed after the process in FIG. 23 of the second embodiment.

Subsequently, as illustrated FIG. 24, using the pattern of photoresist 54 as the etching mask, for example, the dry etching processing is performed on metal layer 55, and the etching processing is stopped before the surface of semiconductor substrate 3 is exposed, thereby forming continuous film-like first structure 5 including first uneven unit 6.

Figure 25:
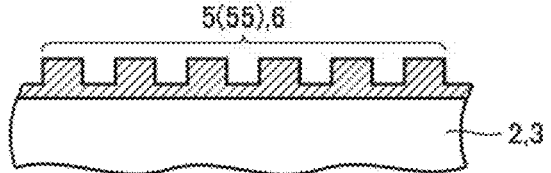
FIG. 25 is a sectional view illustrating a process performed after the process in FIG. 24 of the second embodiment.

Subsequently, as illustrated in FIG. 25, photoresist 54 is removed. Thereafter, semiconductor device 1 in which metal wiring 13 is joined to bonding region 20 is manufactured through processes similar to those in FIGS. 7 to 10 (see FIG. 20).

In semiconductor device 1, as described above, the energy of the ultrasonic wave is dispersed by second uneven unit 8 when the copper wire is joined to second structure 7 by the ultrasonic wave. Furthermore, second structure 7 in which second uneven unit 8 is formed is laminated on first structure 5 in which first uneven unit 6 is formed.

Moreover, first structure 5 including first uneven unit 6 is formed in a continuous film shape. Thus, the energy of the ultrasonic wave accumulated in the recess of first uneven unit 6 can be prevented from directly affecting semiconductor substrate 3 (semiconductor device 1), and damage to semiconductor device 1 can be prevented.

Third Embodiment

Variations of first structure 5 in bonding region 20 will be described below.

First Example

Figure 26:
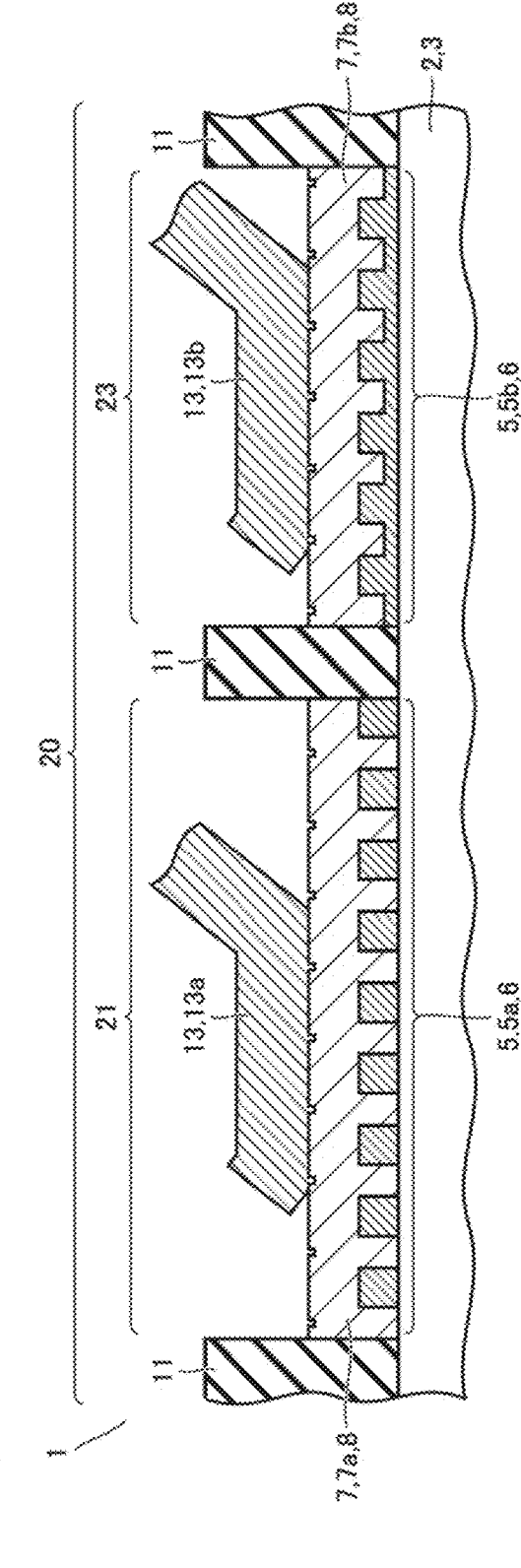
FIG. 26 is a sectional view illustrating a semiconductor device according to first example of a third embodiment.

As illustrated in FIG. 26, in first region 21 in bonding region 20, first structure 5a in which the plurality of protrusions of first uneven unit 6 are arranged on the main surface of semiconductor substrate 3 while being separated from each other is formed as first structure 5. On the other hand, in second region 23 of bonding region 20, continuous film-like first structure 5b including first uneven unit 6 is formed as first structure 5.

Because other configurations are similar to those of semiconductor device 1 in FIG. 2 and the like, the same member is denoted by the same reference numeral, and the description will be omitted unless necessary.

Second Example

Figure 27:
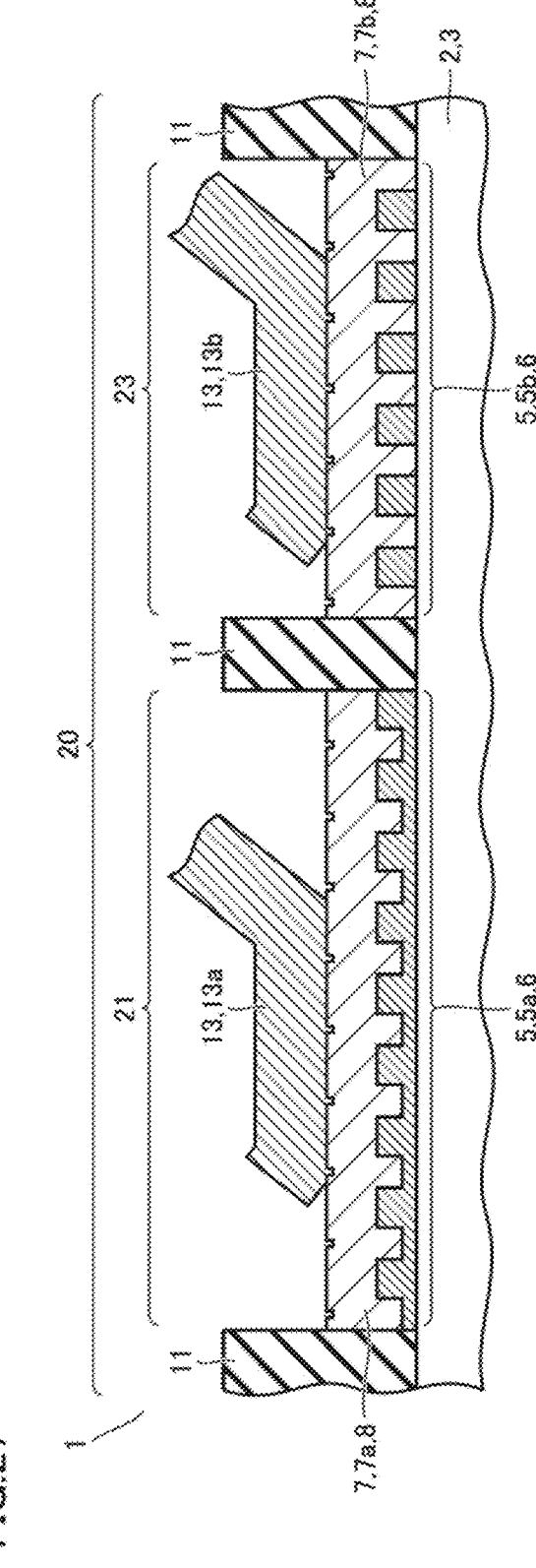
FIG. 27 is a sectional view illustrating a semiconductor device according to a second example of the third embodiment.

As illustrated in FIG. 27, in first region 21 of bonding region 20, continuous film-like first structure 5a including first uneven unit 6 is formed as first structure 5. On the other hand, in second region 23 of bonding region 20, first structure 5b that is disposed on the main surface of semiconductor substrate 3 while the plurality of protrusions of first uneven unit 6 are separated from each other is formed as first structure 5.

Because other configurations are similar to those of semiconductor device 1 in FIG. 2 and the like, the same member is denoted by the same reference numeral, and the description will be omitted unless necessary.

Semiconductor device 1 of the first example or semiconductor device 1 of the second example is manufactured as follows. First, after semiconductor element 2 and the like are formed on semiconductor substrate 3, in one of first region 21 and second region 23 in bonding region 20, first structure 5 including first uneven unit 6 in which the plurality of protrusions are separated from each other is formed through processes similar to the processes in FIGS. 3 to 6.

In the other region of first region 21 and second region 23, continuous film-like first structure 5 including first uneven unit 6 is formed through processes similar to the processes in FIGS. 21 to 25. After first structure 5 is formed, semiconductor device 1 of the first example or semiconductor device 1 of the second example is completed through processes similar to the processes in FIGS. 7 to 10.

In bonding region 20 in semiconductor device 1 of the first example and semiconductor device 1 of the second example, first structure 5 that includes first uneven unit 6 while the plurality of protrusions are separated from each other and continuous film-like first structure 5 including first uneven unit 6 are mixed as first structure 5.

As described above, in continuous film-like first structure 5 including first uneven unit 6, it is possible to suppress the energy of the ultrasonic wave accumulated in the recess of the first uneven unit 6 can be prevented from directly affecting semiconductor substrate 3 (semiconductor device 1) as compared with first structure 5 that includes the first uneven unit 6 while the plurality of protrusions are separated from each other. Thus, options (ranges) of joining conditions such as the energy by the ultrasonic wave during the joining of metal wiring 13 are increased, and structural design corresponding to the function of the semiconductor device becomes possible.

Fourth Embodiment

Semiconductor device 1 including bonding region 20 including one region as bonding region 20 will be described.

First Example

Figure 28:
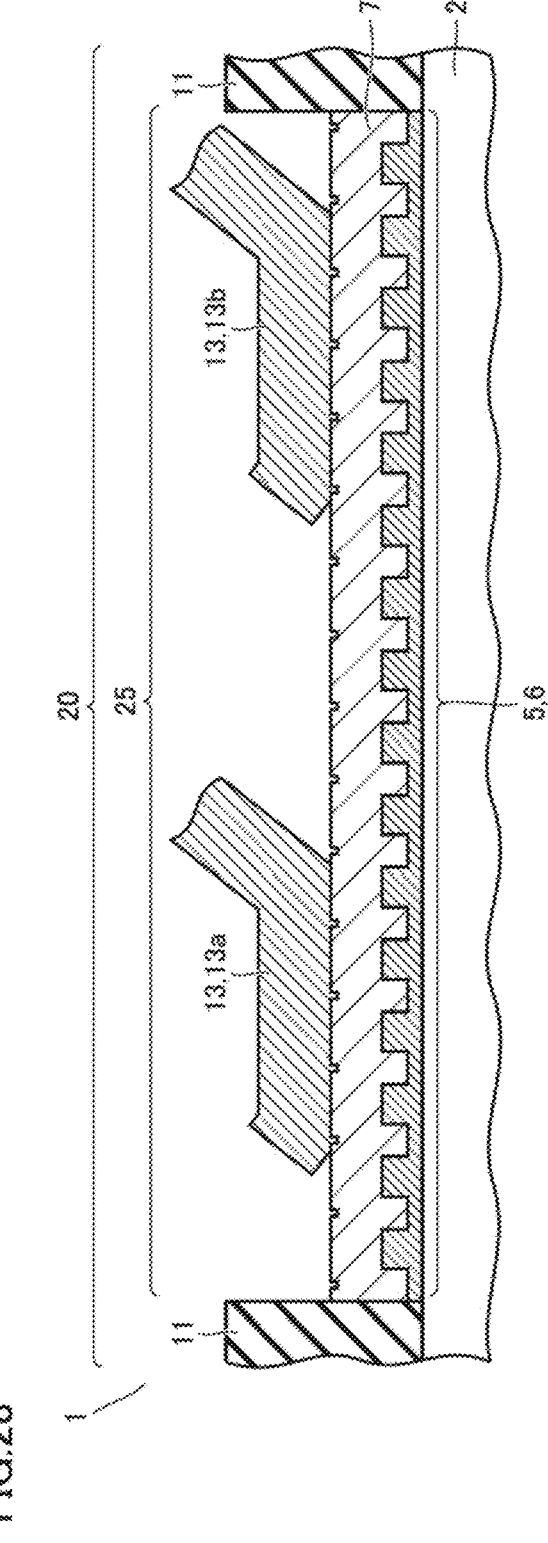
FIG. 28 is a sectional view illustrating a semiconductor device according to a first example of a fourth embodiment.

As illustrated in FIG. 28, bonding region 20 includes one region 25. One region 25 is defined by insulating member 11. In one region 25, a continuous film-like first structure 5 including a first uneven unit 6 is formed as first structure 5. A second structure 7 including a second uneven unit 8 is formed so as to cover first structure 5.

Because other configurations are similar to those of semiconductor device 1 in FIG. 2 and the like, the same member is denoted by the same reference numeral, and the description will be omitted unless necessary.

Second Example

Figure 29:
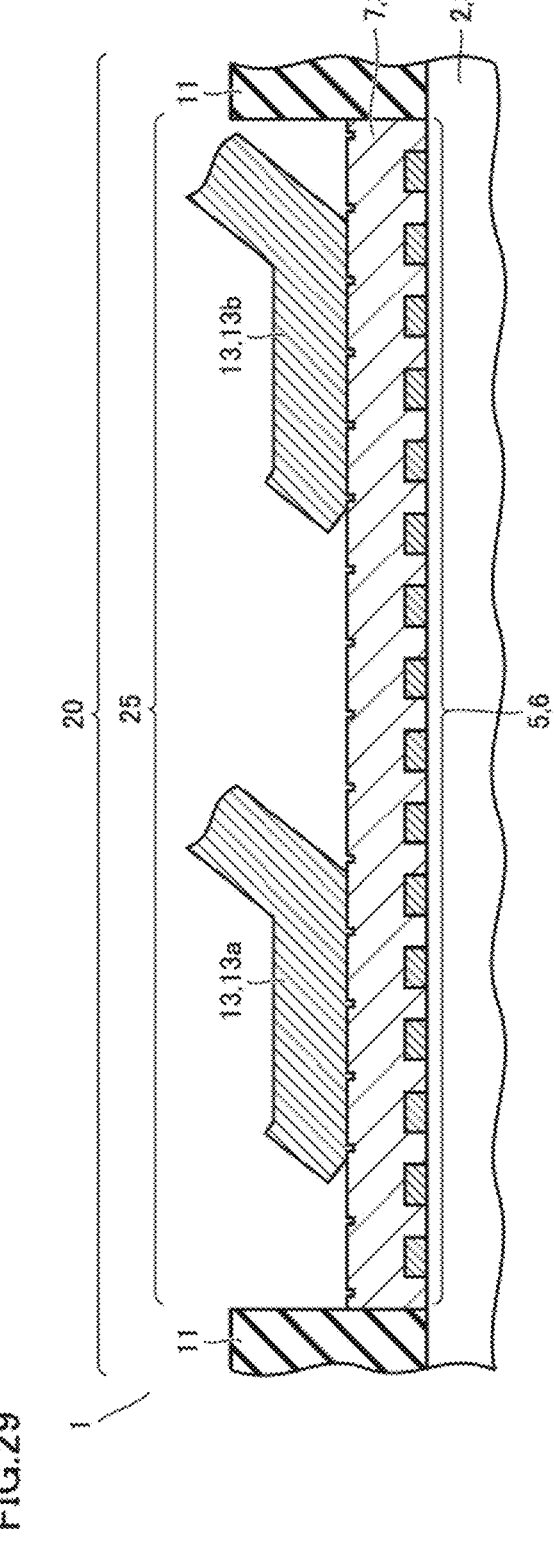
FIG. 29 is a sectional view illustrating a semiconductor device according to a second example of the fourth embodiment.

As illustrated in FIG. 29, bonding region 20 includes one region 25. One region 25 is defined by insulating member 11. First structure 5 in which the plurality of protrusions of first uneven unit 6 are arranged on the main surface of semiconductor substrate 3 in a manner of being separated from each other is formed in one region 25. A second structure 7 including a second uneven unit 8 is formed so as to cover first structure 5.

Because other configurations are similar to those of semiconductor device 1 in FIG. 2 and the like, the same member is denoted by the same reference numeral, and the description will be omitted unless necessary.

In semiconductor device 1 of the first example and semiconductor device 1 of the second example, the following effects can be obtained in addition to the effects described in the first embodiment and the like.

In each semiconductor device 1 described above, bonding region 20 is not divided into a plurality of regions, but is formed of one region 25. Thus, for example, the bonding region can also be formed on the surface of a diode (chip) as the semiconductor element that does not generally require a plurality of electrode pads. As a result, a degree of freedom in structural design as semiconductor device 1 can be increased.

Fifth Embodiment

An electric power converter to which the semiconductor device described in the first to fourth embodiment is applied will be described below. Although the present disclosure is not limited to a specific electric power converter, the case that the present disclosure is applied to a three-phase inverter will be described below as the fifth embodiment.

Figure 30:
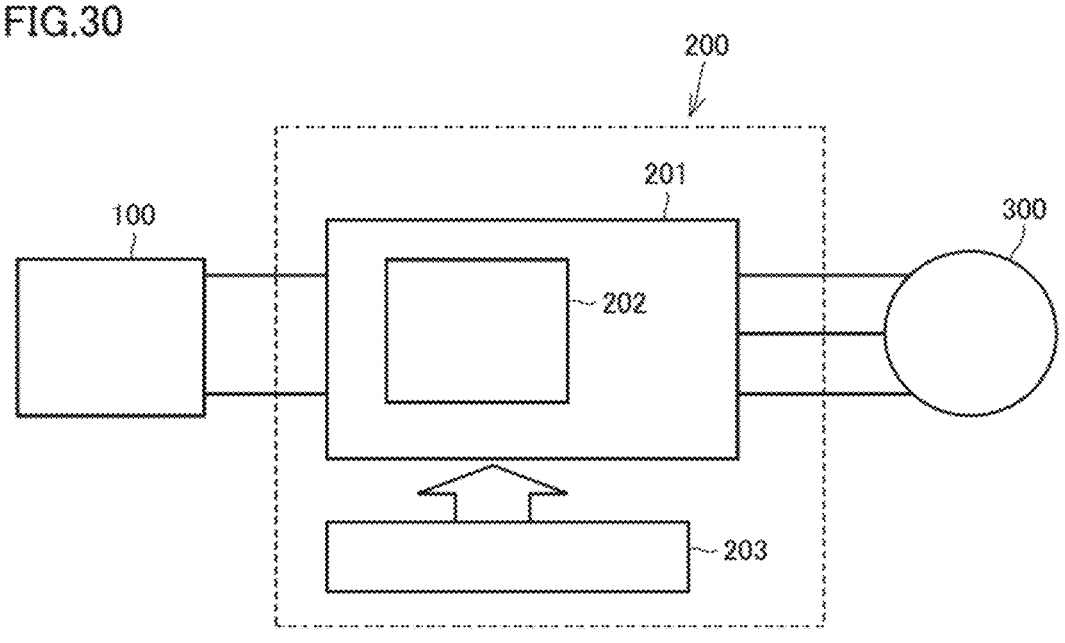
FIG. 30 is a block diagram illustrating an electric power converter according to a fifth embodiment.

FIG. 30 is a block diagram illustrating a configuration of an electric power converter to which a power conversion device according to a fifth embodiment is applied. The power conversion system in FIG. 30 includes a power supply 100, an electric power converter 200, and a load 300. Power supply 100 is a DC power supply, and supplies DC power to electric power converter 200. Power supply 100 can be configured by various devices, and for example, can be configured by a DC system, a solar cell, or a storage battery. A rectifier circuit or an AC/DC converter connected to an AC system may be configured. Power supply 100 may be configured of a DC-DC converter that converts the DC power output from a DC system into predetermined power.

Electric power converter 200 is a three-phase inverter connected between power supply 100 and load 300, converts the DC power supplied from power supply 100 into AC power, and supplies the AC power to load 300. As illustrated in FIG. 30, electric power converter 200 includes a main conversion circuit 201 that converts the DC power into the AC power to output the AC power and a control circuit 203 that outputs a control signal controlling main conversion circuit 201 to main conversion circuit 201.

Load 300 is a three-phase motor driven by the AC power supplied from electric power converter 200. Load 300 is not limited to a specific application, but is a motor mounted on various electric appliances. For example, load 300 is used as a hybrid car, an electric car, a rail vehicle, an elevator, or a motor for an air conditioner.

Electric power converter 200 will be described in detail below. Main conversion circuit 201 includes a switching element (not illustrated) and a freewheel diode (not illustrated). The switching element performs switching to convert the DC power supplied from power supply 100 into the AC power, whereby the AC power is supplied to load 300. Although there are various specific circuit configurations of main conversion circuit 201, main conversion circuit 201 according to the sixth embodiment is a two-level three-phase full bridge circuit, and can be configured by six switching elements and six freewheel diodes connected in anti-parallel to the respective switching elements.

At least one of each switching element and each freewheel diode of main conversion circuit 201 is a switching element or a freewheel diode included in semiconductor device 202 corresponding to semiconductor device 1 of at least one of the first to third embodiments. Six switching elements are connected in series in every two switching elements to constitute upper and lower arms, and each upper and lower arm constitutes each phase (U-phase, V-phase, W-phase) of the full bridge circuit. An output terminal of each of the upper and lower arms, namely, three output terminals of main conversion circuit 201 are connected to load 300.

Main conversion circuit 201 includes a drive circuit (not illustrated) that drives each switching element, hut the drive circuit may be built in semiconductor device 202, or include the drive circuit separately from semiconductor device 202. The drive circuit generates a drive signal driving the switching element of main conversion circuit 201, and supplies the drive signal to the control electrode of the switching element of main conversion circuit 201. Specifically, the drive signal turning on the switching element and the drive signal turning off the switching element are output to the control electrode of each switching element according to the control signal from control circuit 203 (described later). The drive signal is a voltage signal (ON signal) greater than or equal to a threshold voltage of the switching element when the switching element is maintained in an ON state, and the drive signal is a voltage signal (OFF signal) equal to or smaller than the threshold voltage of the switching element when the switching element is maintained in an OFF state.

Control circuit 203 controls the switching elements of main conversion circuit 201 such that desired power is supplied to load 300. Specifically, time (ON time) during which each switching element of main conversion circuit 201 is to be turned on is calculated based on the power to be supplied to load 300. For example, main conversion circuit 201 can be controlled by PWM control that modulates the ON time of the switching element according to the voltage to be output. A control command (control signal) is output to the drive circuit included in main conversion circuit 201 such that the ON signal is output to the switching element to be turned on at each time point, and such that the OFF signal is output to the switching element to be turned off at each time point. The drive circuit outputs the ON signal or the OFF signal as the drive signal to the control electrode of each switching element according to the control signal.

In electric power converter 200 of the fifth embodiment, semiconductor device 1 of the first to fourth embodiments is applied as semiconductor device 202 constituting main conversion circuit 201. Thus, the copper wire or the like can be firmly and favorably joined to bonding region 20 as metal wiring 13. As a result, the reliability of electric power converter 200 can be improved.

Although the example in which the present disclosure is applied to the two-level three-phase inverter is described in the fifth embodiment, the present disclosure is not limited to the fifth embodiment, but can be applied to various electric power converters. In the fifth embodiment, the two-level electric power convener is used. However, a three-level or multi-level electric power converter may be used, or the present disclosure may be applied to a single-phase inverter when the power is supplied to a single-phase load. In addition, the present disclosure can also be applied to a DC/DC converter, an AC/DC converter, or the like when the power is supplied to a DC load or the like.

In addition, the electric power converter to which the present disclosure is applied is not limited to the case where the load described above is the electric motor, but can also be used as, for example, a power supply device for an electric discharge machine, a laser beam machine, an induction heating cooker, or a non-contact power feeding system, and can also be used as a power conditioner for a solar power generation system, a power storage system, or the like.

Semiconductor device 1 described in respective embodiments can be combined in various ways as necessary.

The above embodiments are only by way of example, and the present disclosure is not limited to the above embodiments. The scope of the present disclosure is defined by not the above description, but the claims, and it is intended that all modifications within the meaning and scope of the claims are included in the present disclosure.

INDUSTRIAL APPLICABILITY

The present disclosure is effectively used in the semiconductor device that joins the metal wiring to the bonding region.

REFERENCE SIGNS LIST

1: semiconductor device, 2: semiconductor element, 3: semiconductor substrate, 5, 5a, 5b: first structure, 6:

first uneven unit, 7, 7a, 7b: second structure, 8: second uneven unit, 9, 9a, 9b: intermediate structure, 11: insulating member, 13, 13a, 13b: metal wiring, 20: bonding region, 21: first region, 23: second region, 25: one region, 51, 52, 53, 54: resist, 55, 77: metal layer, 100: power supply, 200: electric power converter, 201: main conversion circuit, 202: semiconductor device, 203: control circuit, 300: load

The invention claimed is:

1. A semiconductor device comprising:
a semiconductor substrate on which a semiconductor element is formed;
a bonding region defined in the semiconductor substrate;
an insulating member formed so as to be in contact with the semiconductor substrate and defining the bonding region;
a first structure including a first uneven unit and formed in the bonding region;
a second structure including a second uneven unit and formed so as to cover the first structure; and
a metal wiring joined to the second uneven unit in the second structure,
wherein a depth of a recess in the second uneven unit is shallower than a depth of a recess in the first uneven unit,
wherein the insulating member is formed so as to surround the first structure and the second structure, and
wherein the bonding region is partitioned by the insulating member into;
a first region having a first area; and
a second region having a second area.

2. The semiconductor device according to claim 1, wherein the first uneven unit is intermittently formed such that protrusions are separated from each other.

3. The semiconductor device according to claim 1, wherein the first uneven unit is formed in a continuous film shape.

4. The semiconductor device according to claim 1, wherein
the second area is smaller than the first area.

5. The semiconductor device according to claim 4, wherein the first structure and the second structure are disposed in at least the second region.

6. The semiconductor device according to claim 1, wherein the second structure includes metal having Vickers hardness of greater than or equal to 300.

7. The semiconductor device according to claim 6, wherein the metal contains nickel (Ni), cobalt (Co), or chromium (Cr).

8. The semiconductor device according to claim 1, wherein the first structure includes oxide.

9. The semiconductor device according to claim 1, wherein an intermediate structure is interposed between the first structure and the second structure.

10. The semiconductor device according to claim 1, wherein the metal wiring includes copper wiring.

11. An electric power converter comprising:
a main conversion circuit including the semiconductor device according to claim 1, the main conversion circuit to convert and output input power; and
a control circuit to output a control signal controlling the main conversion circuit to the main conversion circuit.

12. A semiconductor device comprising:
a semiconductor substrate on which a semiconductor element is formed;
a bonding region defined in the semiconductor substrate;

a first structure including a first uneven unit and formed in the bonding region;

an intermediate structure formed on the first structure;

a second structure including a second uneven unit and formed so as to cover the first structure and the intermediate structure; and a metal wiring joined to the second uneven unit in the second structure, wherein a depth of a recess in the second uneven unit is shallower than a depth of a recess in the first uneven unit; and wherein a width of the recess in the second uneven unit is less than a width of the recess in the first uneven unit.

13. The semiconductor device according to claim 1, wherein the first structure and the second structure are disposed in at least the first region, and the first structure reaches the insulating member.

14. The semiconductor device according to claim 13, wherein the second structure reaches the insulating member.

15. The semiconductor device according to claim 1, wherein a width of the recess in the second uneven unit is less than a width of the recess in the first uneven unit.

16. The semiconductor device according to claim 12, wherein the recess in the second uneven unit is provided between protrusions of the first uneven unit, and the width of the recess in the second uneven unit is smaller than a distance between the recess of the second uneven unit and one of the protrusions of the first uneven unit adjacent to the recess of the second uneven unit.

* * * * *